United States Patent
Illegems (10) Patent No.: US 8,836,029 B2
(45) Date of Patent: Sep. 16, 2014

(54) TRANSISTOR WITH MINIMIZED RESISTANCE

(75) Inventor: Paul F. Illegems, Tuscon, AZ (US)

(73) Assignee: SMSC Holdings S.A.R.L., Hauppauge, NY (US)

( * ) Notice: Subject to any disclaimer, the term of this patent is extended or adjusted under 35 U.S.C. 154(b) by 0 days.

(21) Appl. No.: 13/407,783

(22) Filed: Feb. 29, 2012

(65) Prior Publication Data

US 2013/0221437 A1 Aug. 29, 2013

(51) Int. Cl.
*H01L 29/66* (2006.01)

(52) U.S. Cl.
USPC ............ 257/342; 257/204; 257/758; 257/666; 257/349; 257/401

(58) Field of Classification Search
USPC ................. 257/342, 204, 758, 666, 349, 401
See application file for complete search history.

(56) References Cited

U.S. PATENT DOCUMENTS

| | | | | |
|---|---|---|---|---|
| 4,148,047 A * | 4/1979 | Hendrickson | ................. | 257/332 |
| 4,636,825 A * | 1/1987 | Baynes | .......................... | 257/401 |
| 4,833,513 A * | 5/1989 | Sasaki | .......................... | 257/342 |
| 5,192,989 A * | 3/1993 | Matsushita et al. | ............ | 257/342 |
| 5,355,008 A * | 10/1994 | Moyer et al. | .................. | 257/341 |
| 5,412,239 A * | 5/1995 | Williams | ....................... | 257/343 |
| 5,672,894 A * | 9/1997 | Maeda et al. | .................. | 257/343 |
| 5,689,129 A * | 11/1997 | Pearce | ............................ | 257/341 |
| 5,844,277 A * | 12/1998 | Hshieh et al. | .................. | 257/341 |
| 5,945,730 A * | 8/1999 | Sicard et al. | ................... | 257/666 |
| 5,998,837 A * | 12/1999 | Williams | ....................... | 257/341 |
| 6,118,149 A * | 9/2000 | Nakagawa et al. | ........... | 257/330 |
| 6,320,223 B1 * | 11/2001 | Hueting et al. | ................ | 257/341 |
| 6,344,379 B1 * | 2/2002 | Venkatraman et al. | ........ | 438/192 |
| 6,627,948 B1 * | 9/2003 | Fujihira | ......................... | 257/328 |
| 6,864,533 B2 * | 3/2005 | Yasuhara et al. | .............. | 257/342 |
| 6,897,561 B2 * | 5/2005 | Nemtsev et al. | .............. | 257/758 |
| 6,903,460 B2 * | 6/2005 | Fukuda et al. | ................. | 257/758 |
| 6,943,410 B2 * | 9/2005 | Fujihira et al. | ................. | 257/339 |
| 6,946,706 B1 * | 9/2005 | Brisbin et al. | ................. | 257/343 |
| 7,057,273 B2 * | 6/2006 | Harnden et al. | ............... | 257/696 |
| 7,816,756 B2 * | 10/2010 | Saito | ............................. | 257/492 |
| 7,944,048 B2 * | 5/2011 | Jiang | ............................. | 257/737 |
| 7,956,384 B2 * | 6/2011 | Mallikararjunaswamy | .. | 257/203 |
| 8,026,558 B2 * | 9/2011 | Grebs et al. | .................... | 257/401 |
| 8,400,784 B2 * | 3/2013 | You | ................................ | 361/813 |
| 2001/0042592 A1 * | 11/2001 | Kulinsky | ....................... | 156/268 |
| 2002/0195662 A1 * | 12/2002 | Eden et al. | ..................... | 257/349 |
| 2004/0245638 A1 * | 12/2004 | Nemtsev et al. | .............. | 257/758 |
| 2007/0295996 A1 * | 12/2007 | Mallikararjunaswamy | .. | 257/204 |
| 2008/0035959 A1 * | 2/2008 | Jiang | ............................. | 257/204 |

(Continued)

*Primary Examiner* — Fernando L Toledo
*Assistant Examiner* — Mohammed Shamsuzzaman
(74) *Attorney, Agent, or Firm* — King & Spalding L.L.P.

(57) ABSTRACT

The present disclosure discloses a power transistor array designed to have a very low resistance. The power transistor array includes a bottom metal layer and a top metal layer. The bottom metal layer includes a plurality of strips, each corresponding to either drain or source strips, the drain and source strips being placed in parallel and alternating with each other. Further, the top metal layer, above the bottom metal layer, includes a plurality of strips. Each strip corresponds to either drain or source strips, the drain and the source strips being placed and alternating with each other. The strips of the top metal layer are oriented at angle with respect to the strips of the bottom metal layer. Moreover, the power transistor includes a plurality of bond pads on the top metal layer, and bond wires with one end attached to the corresponding bond pad.

14 Claims, 7 Drawing Sheets

(56) References Cited

U.S. PATENT DOCUMENTS

| | | | |
|---|---|---|---|
| 2009/0194424 A1* | 8/2009 | Franklin et al. | 205/114 |
| 2010/0007316 A1* | 1/2010 | Miller et al. | 323/282 |
| 2011/0031947 A1* | 2/2011 | You | 323/282 |
| 2011/0237038 A1* | 9/2011 | Mallikararjunaswamy | 438/279 |
| 2012/0126406 A1* | 5/2012 | Dix | 257/738 |
| 2012/0235241 A1* | 9/2012 | Barrow | 257/368 |
| 2012/0273963 A1* | 11/2012 | Mirsky et al. | 257/774 |
| 2013/0125393 A1* | 5/2013 | You | 29/840 |

* cited by examiner

FIG. 5A — Via under bond pads

FIG. 5B — No Vias under bond pads

TRANSISTOR WITH MINIMIZED RESISTANCE

TECHNICAL FIELD

The present disclosure relates to electronic devices, and more particularly to transistors having low resistance.

BACKGROUND

MOSFETs (Metal-Oxide-Semiconductor Field Effect Transistor) are the most widely used form of transistor today. MOSFETs function as discrete components as well as form the basis of complex Integrated Circuits (ICs). The MOSFET generally has three terminals, namely, a source, a drain and a gate, where the gate serves to define a conducting channel between the drain and source terminals to control current flow between them. The structure of such MOS devices is obtained by growing different metal layers on top of a silicon layer.

Largely, MOS devices are made from the standard industrial CMOS (Complementary metal-oxide-semiconductor) process in which the source and drain are connected at the surface of the wafer. Such conventional transistors utilize the horizontal and vertical pattern of metallization where all layers are interconnected with each other, with the top layer being connected to pins on the IC through wires. In such designs, the length of the interconnectivity wires increases the complexity of the device since current has a longer path to flow in the device. Other existing solutions define the transistor structure with multiple metal layers as bottom layers, middle layers, and top layers. The lower metal layers are connected to the source and the drain regions. The middle layers are connected with each other and are further connected to the source region. The top metal layers are tied together and are connected to the drain region through openings in the middle layers. The main disadvantage of such a design is that they result in a high resistance and the resistance cannot be reduced beyond a certain value or limit. Although low interconnect resistances can be achieved with the existing solutions, they do not allow reducing the resistance beyond a certain minimum level. Thus, there is a need to design a transistor to overcome the discussed limitations.

SUMMARY

Briefly described, and according to one embodiment, the present disclosure describes a power transistor array designed to have a very low resistance. The power transistor array includes a bottom metal layer and a top metal layer. The bottom metal layer includes a plurality of strips, each corresponding to either drain or source strips, the drain and source strips being placed in parallel and alternating with each other. Further, the top metal layer, above the bottom metal layer, includes a plurality of strips. Each strip corresponds to either drain or source strips, the drain and the source strips being placed and alternating with each other. The strips of the top metal layer are oriented at angle with respect to the strips of the bottom metal layer. Moreover, the power transistor includes a plurality of bond pads on the top metal layer, and bond wires with one end attached to the corresponding bond pad.

Other embodiments of the disclosure discloses a power transistor array, including a plurality of metal layers, each layer including a plurality of strips, each strip corresponding to either a drain strip or a source strip, wherein the metal layers include at least two of the following metal layers. The power transistor array includes a bottom metal layer, the strips of the bottom metal layer being arranged in parallel and alternating as drain strips and source strips. Further, the array include a first metal layer formed over the bottom metal layer, the strips of the first metal layer running in parallel to one another above the strips of the bottom metal layer. The transistor array also includes a second metal layer formed over the first metal layer, wherein the strips of the second metal layer are oriented perpendicular to the strips of the first metal layer. Furthermore, the transistor array includes a third metal layer formed over the second metal layer, wherein the strips of the third metal layer are oriented diagonally with respect to the strips of the second metal layer. Moreover, the array includes a fourth metal layer formed over the third metal layer, wherein the strips of the fourth metal layer are oriented perpendicular to the strips of the third metal layer. Additionally, the array includes a top metal layer formed over the fourth metal layer, the strips of the top metal layer being oriented perpendicular with respect to the strips of the fourth metal layer.

Still other embodiments of the disclosure describe a semiconductor integrated circuit having a power transistor or transistor array having a bottom metal layer and the top metal layers (discussed above in detail). Along with the metal layers, the transistor includes a plurality of bond pads, each being placed on the strips of the top metal layer. Also, the transistor includes a plurality of bond wires, each bond wire having one end attached to the corresponding bond pad.

Additional embodiments of the disclosure describe a method for designing a transistor with one or more layers arranged in a fashion to minimize resistance to a pre-defined level. The method includes forming a bottom metal layer with a plurality of strips, each corresponding to either a drain strip or a source strip, the drain and source strips being placed in parallel and alternating with each other. The method further includes forming a top metal layer over the bottom metal layer, the top metal layer having a plurality of strips, each corresponding to either a drain strip or a source strip, wherein the strips of the top layer have a lower resistance than the strips of the bottom layer, and the strips of the top metal layer are oriented diagonally with respect to the strips of the bottom metal layer. The method also includes placing a bond pad on each strip of the top metal layer. Moreover, the method includes connecting a bond wire to each bond pad.

While the invention is amenable to various modifications and alternative forms, specific embodiments are shown by way of example in the drawings and are described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION

Overview

Embodiments of the disclosure describe a power transistor having a very low resistance. The power transistor includes a bottom metal layer including a number of strips, each strip corresponding to either drain or source, where the drain and source strips are placed in parallel and alternate with each other. A top metal layer, above the bottom metal layer, includes a number of strips, each strip corresponding to either drain or source, where the drain and source strips are placed in parallel and alternate with each other. The top layer has a relatively low resistance, and the strips of the top metal layer are oriented diagonally with respect to the strips of the bottom metal layer. Bond pads are placed on the strips of the top metal layer. One or more bond wires emanate from each bond pad and lead to a pin on the chip. Such a transistor design may have a very low total on-resistance from pin to pin. Any number of metal layers may lie between the top metal layer and bottom metal layer.

Overall Exemplary Embodiment

Figure 1:
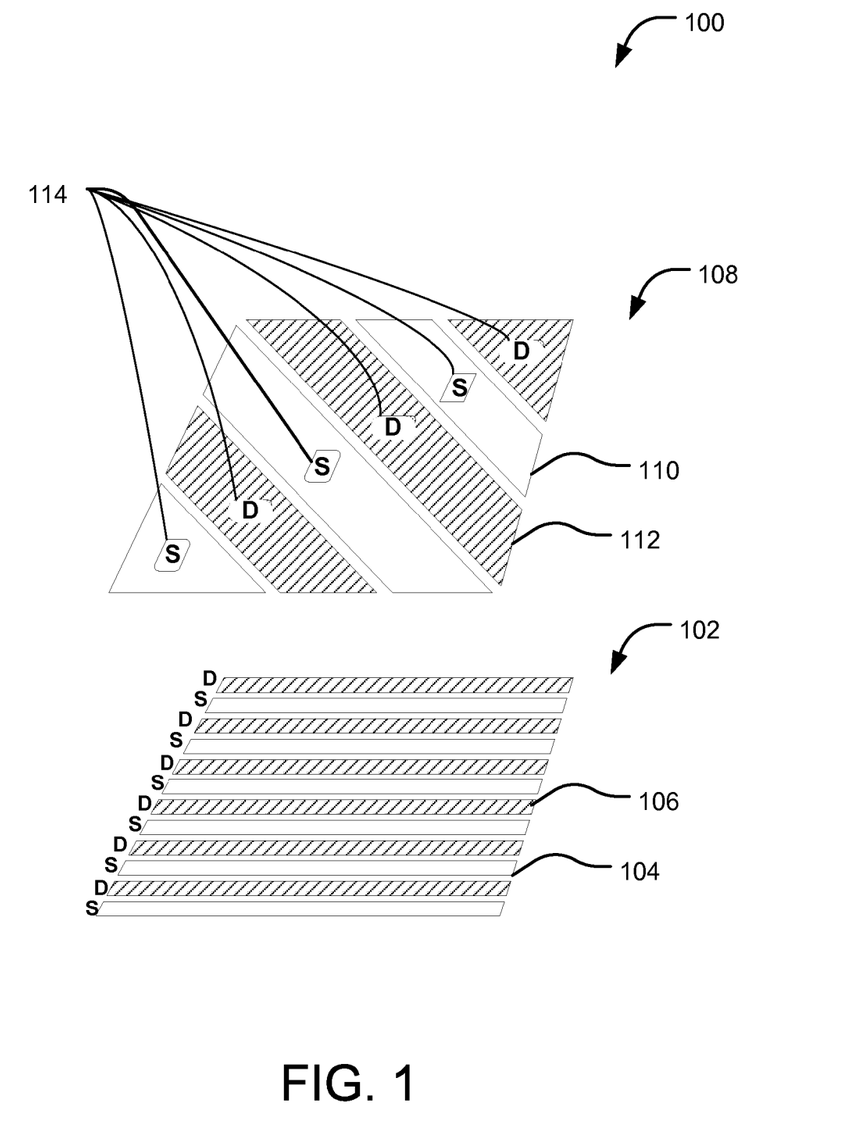
FIG. 1 illustrates the metallization structure for a power transistor array having two metal layers.

FIG. 1 illustrates the metal layers 100 of a power transistor array having very low resistance. The layers 100 include two metal layers shown as a bottom metal layer 102 and a top metal layer 108.

The bottom metal layer 102 includes a number of strips 104 and 106 running in the horizontal direction as shown in FIG. 1. As shown, each solid white strip 104 corresponds to a source-specific strip for the transistor array, while each patterned strip 106 corresponds to a drain-specific strip, referred to herein for convenience as source strips and drain strips, respectively. The drain strips 106 and the source strips 104 are placed in parallel and alternate with each other. For clarity purposes, the drain and the source strips have been marked as "d" and "s", respectively, in FIG. 1.

Similarly, the top metal layer 108 lies above the bottom metal layer 102. The top metal layer 108 also includes a number of strips 110 and 112 running in the horizontal direction, however the strips 110 and 112 are oriented diagonally with respect to the strips of the bottom metal layer 102. Each solid white strip 110 corresponds to a source strip, while each patterned strip 112 corresponds to a drain strip. The drain strips 112 and the source strips 110 are placed in parallel and alternate with each other. Any number of metal layers may lie between the top metal layer 108 and bottom metal layer 102. The top metal layer 108 has a relatively low resistance as compared to other metal layers. The top metal layer 108 spreads out the drain and source current equally over the transistor 100.

Bond pads 114 are placed on each strip of the top metal layer 108. For instance, the bond pads placed on the drain strips correspond to the "drain bond pads", whereas the bond pads on the source strips are "source bond pads". For easy understanding, the drain and source bond pads will be simply referred to as bond pads 114, throughout the description. From each bond pad, one or more bond wires (not shown) emanate and lead to a pin on the chip (not shown). Such a transistor design may have a very low total on-resistance from pin to pin.

Exemplary Transistor Structure

Figure 2:
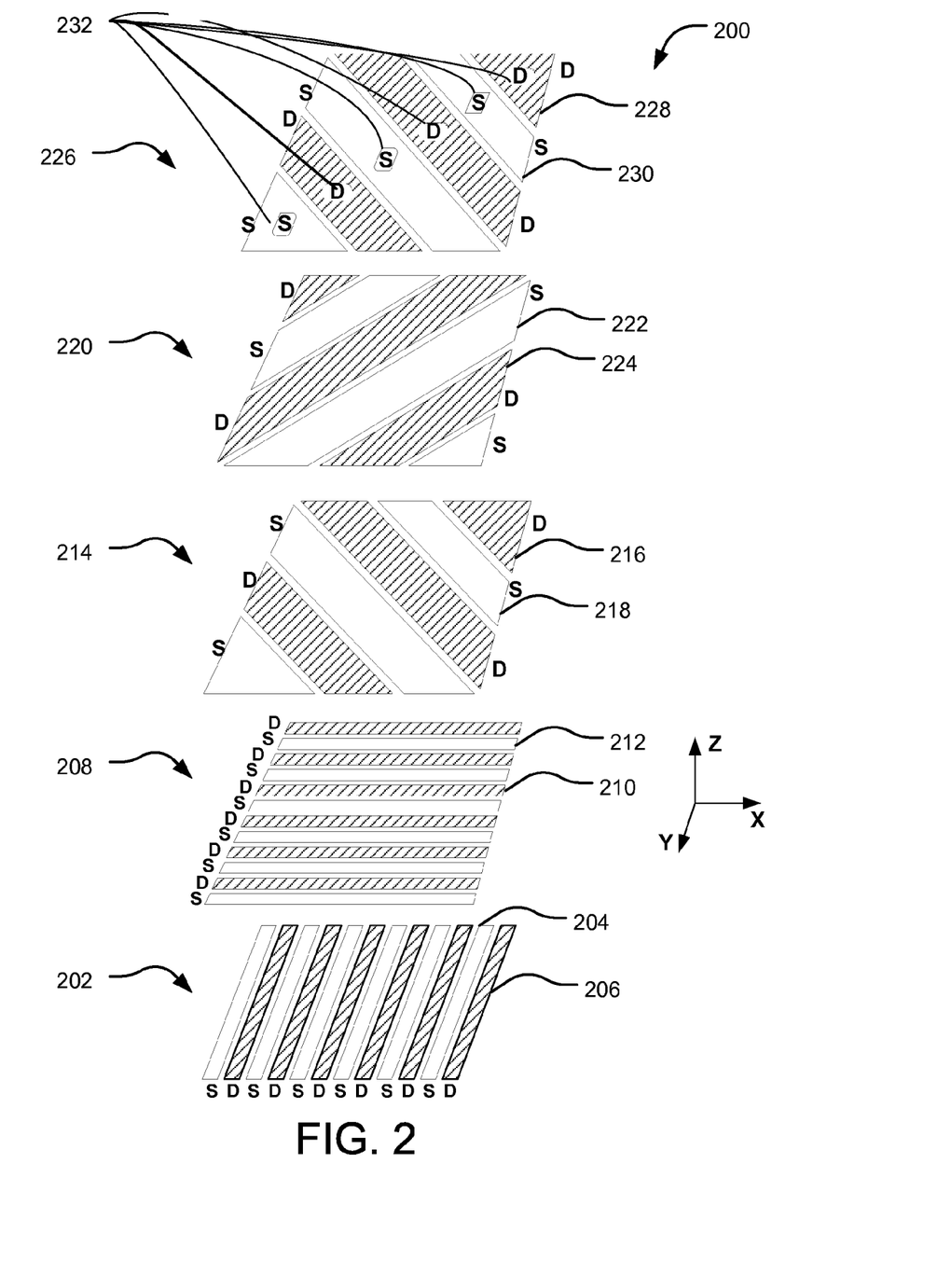
FIG. 2 shows another exemplary metallization structure for a power transistor array including multiple metal layers.

Now moving on to the description of FIG. 2. FIG. 2 illustrates another embodiment of a power transistor array arrangement 200 having several metal layers shown as 202, 208, 214, 220, and 226. Each metal layer includes, substantially flat strips, each corresponding to either drain or source, the drain and source strips being placed in parallel and alternating with each other.

The metal layer 202 is the bottom-most layer including drain strips 206 and source strips 204 having their longitudinal axes aligned with the Y axis, as shown in FIG. 2. The bottom metal layer 202 is commonly formed on a silicon substrate or epitaxial layer. Above the bottom metal layer 202 are the strips of the first metal layer (not shown) running in parallel, above the strips of the bottom metal layer 202. Each source strip of the first metal layer lies over a source strip 204 of the bottom metal layer 202, and each drain strip of the first metal layer lies over a drain strip 206 of the bottom metal layer 202. In some embodiments, the first metal layer may be oriented perpendicular to the bottom metal layer 202.

The second metal layer 208 lies over the first metal layer. The drain strips 210 and source strips 212 of the second metal layer 208 are oriented perpendicular to the strips of the first metal layer. The longitudinal axes of the strips 210 and 212 are parallel to the X axis.

The third metal layer 214 is positioned over the second metal layer 208, and the drain strips 216 and source strips 218 of the third metal layer 214 are oriented diagonally with respect to the strips 210 and 212 of the second metal layer 208 below it. It will be appreciated that the term diagonally is used broadly and is not limited to a corner-to-corner direction relative to the quadrilateral defined by the strips of the second metal layer 208. The strips of the third metal layer 214 merely require to be angled relative to those of the second metal layer 208.

The fourth metal layer 220 lying over the third metal layer 214 has its source strips 222 and drain strips 224 oriented perpendicular to the strips 218 and 216 of the third metal layer 214. In various aspects, the fourth metal layer 220 may be oriented at an angle with respect to the strips of the third metal layer 214.

A top metal layer 226 is oriented in a similar manner as the third metal layer 214. The top metal layer 226 lies over the fourth metal layer, the source strips 230 and drain strips 228 of the top metal layer 226 being oriented perpendicular to the strips of the fourth metal layer 220. In an embodiment, one or more vias between the different metal layers are created for better distribution of the current. The top metal layer 226 can be thicker as compared to other metal layers and has a low sheet resistance, in some embodiments. Consequently, the current in the top metal layer 226 flows laterally and in the lower metal layers the current runs mostly vertical, leads to much reduced total resistance. The width of the top layer strips may be defined so as to accommodate the bond pad openings (discussed below), for some implementations.

Bond pads 232 are formed on the strips 228 and 230 of the top metal layer 226. One or more bond wires (not shown) emanate from each bond pad 232 and lead to a pin on the chip (not shown). Source bond pads are placed near the center of the source strip 230, while drain bond pads are placed near the center of the drain strip 228. Placing the bond pads 232 at the center of each strip helps in reducing the length of bond wires for connecting to the die or chip area. Also, having the bond pads in the middle of the strip allows current to flow in opposite directions, effectively halving the path resistance. Therefore, such transistor design provides for a very low total on-resistance from pin to pin.

Top View of the Exemplary Transistor

Figure 3:
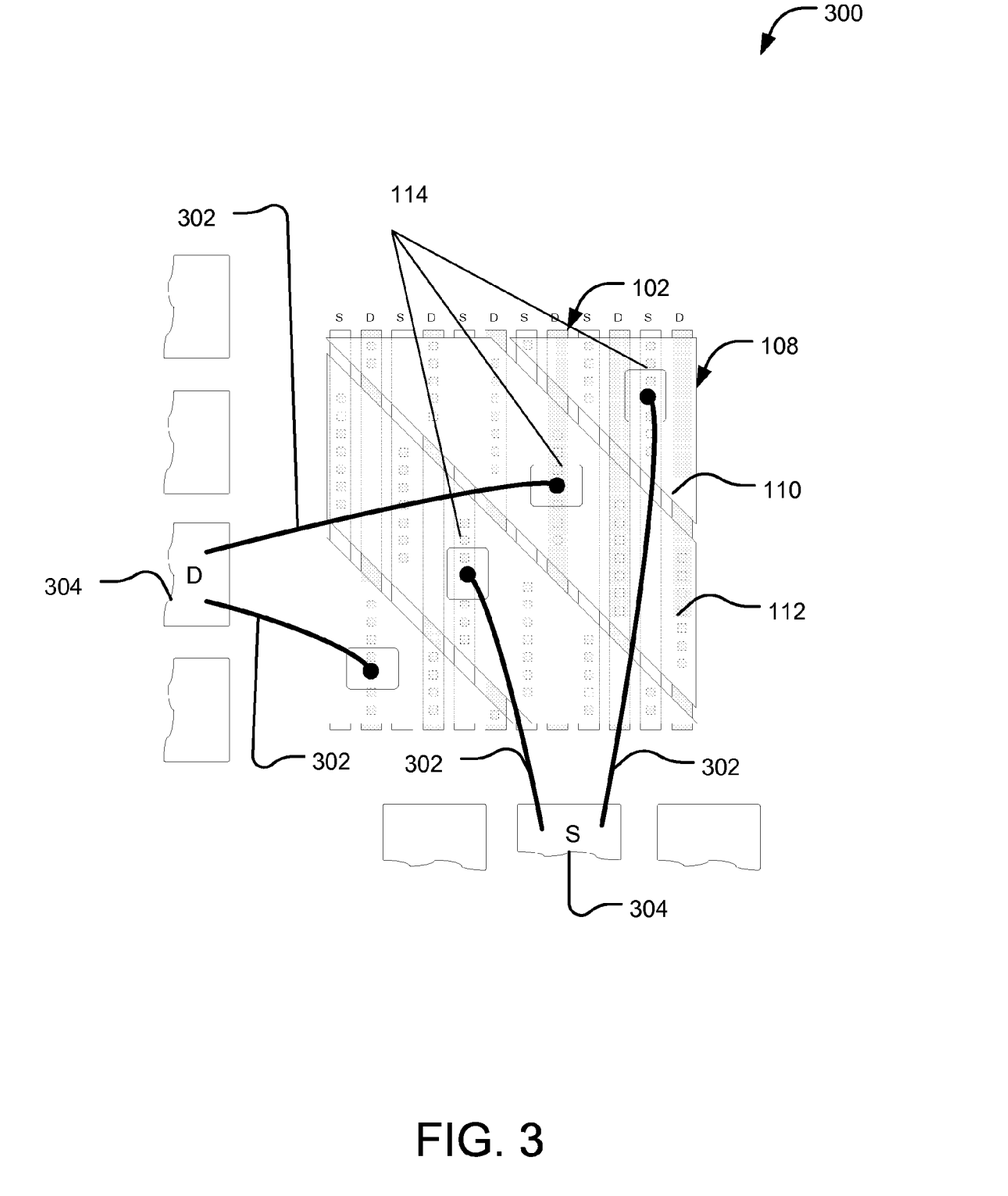
FIG. 3 demonstrates the top view of the structure of FIG. 1.

FIG. 3 illustrates the top view 300 of the metal layers as shown in FIG. 1. The top view 300 only shows the structure and the cross section of the top metal layer 108 as discussed above. Below the top metal layer 108 is the bottom layer 102.

As shown, the top metal layer 108 includes diagonal source strips 110 and drain strips 112 having bond pads 114. Bond wires 302 emanate from the bond pads 114 and lead to pins 304 on the chip.

As shown in FIG. 3, the center placement of bond pads 114 results in a diagonal arrangement of the bond wires and multiple current paths (not shown), which allow the current to go two ways (as illustrated in more detail in FIG. 4), effectively halving the resistance and doubling the current capability. It will be understood that all embodiments of the present disclosure include alternating bond pads and the resulting substantially parallel current paths. As is clear from FIG. 3, the bond wires for the drain pass to a first side of the chip and the source bond wires pass to a side lying perpendicularly to the first side. The discussed structure allows the power transistor to be placed in the corner of a large chip.

Exemplary Current Flow Directions in the Transistor

Figure 4:
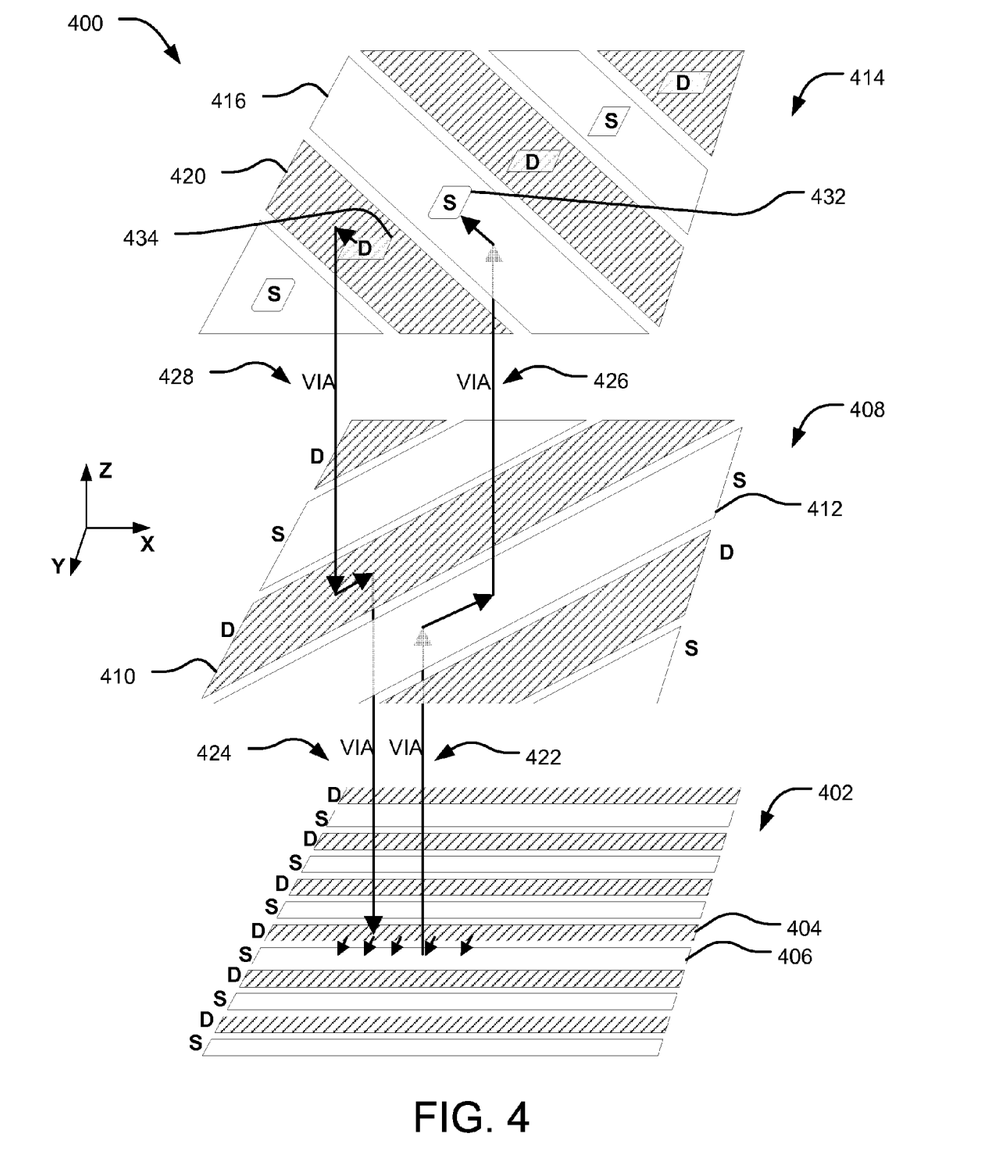
FIG. 4 shows current flow directions in the power transistor structure.

FIG. 4 depicts current flow within an exemplary power transistor structure 400, which includes three metal layers—a bottom metal layer 402, a middle metal layer 408, and a top metal layer 414.

Each metal layer includes several, substantially flat strips, each corresponding to either drain or source, the drain and source strips being placed in parallel and alternating with each other. The bottom metal layer 402 includes source strips 406 and drain strips 404; the middle metal layer 408 includes source strips 412 and drain strips 410; and the top metal layer 414 includes source strips 416 and drain strips 420.

The strips 404 and 406 of the bottom metal layer 402 have their longitudinal axes in parallel with the X axis. Above the bottom metal layer 402, the strips 410 and 412 of the middle metal layer 408 have their longitudinal axes oriented in a direction diagonal to the strips 404 and 406 of the bottom metal layer 402. Above the middle metal layer 408, the strips 416 and 420 of the top metal layer 414 have their longitudinal axis oriented in a direction perpendicular to the longitudinal axis of the strips 410 and 412 of the middle metal layer 408.

As shown in FIG. 4, one or more vias are created between the different metal layers for the current flow. The vias are used between the metal layers to connect the top metal layer to the active region of the transistor. Through a first via 422 between the bottom metal layer 402 and the middle metal layer 408, the current flows vertically upwards from the bottom metal layer's source strip 406 to the middle metal layer's source strip 412. From there, the current travels to a second via 426 between the middle metal layer 408 and the top metal layer 414. From the middle metal layer's source strip 412, the current flows further upwards, vertically to the top metal layer's source strip 416 and eventually to the source bond pad 432. Then, the current flows through the connected bond wire (not shown) to the chip (not shown) and returns through a drain bond wire (not shown) to the drain bond pad 434.

From the drain bond pad 434, the current travels to the via 428 and flows vertically downwards to the middle metal layer's drain strip 410. The current flows towards the via 424 and through it flows vertically downwards to the bottom metal layer's drain strip 404. From here, the current passes to the drain region (not shown) and via the channel of the MOSFET (not shown) to the source region (not shown) of the MOSFET, and returns to the bottom metal layer's source strip 406, completing the loop. From FIG. 4, it can be seen than the current's flow can be limited to a predetermined path through strategic placement of the vias. This concept will be elaborated in FIGS. 5 and 6. In some implementations, certain vias may be omitted to achieve a pre-defined uniformity of current density in the transistor devices.

Figure 5A:
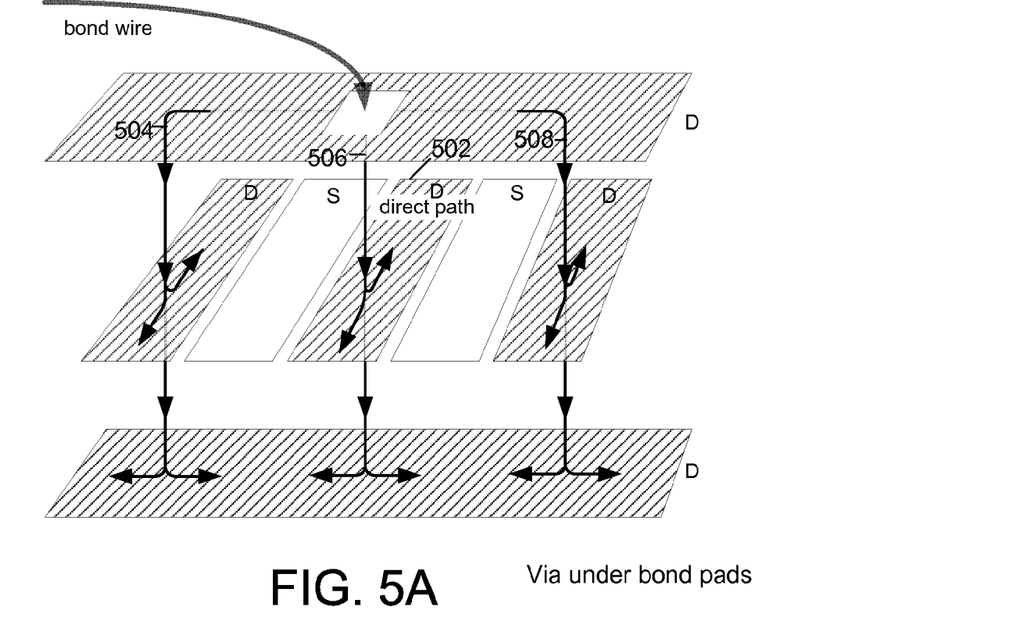
FIGS. 5A and 5B are diagrams showing current travel paths in the structure.
Figure 5B:
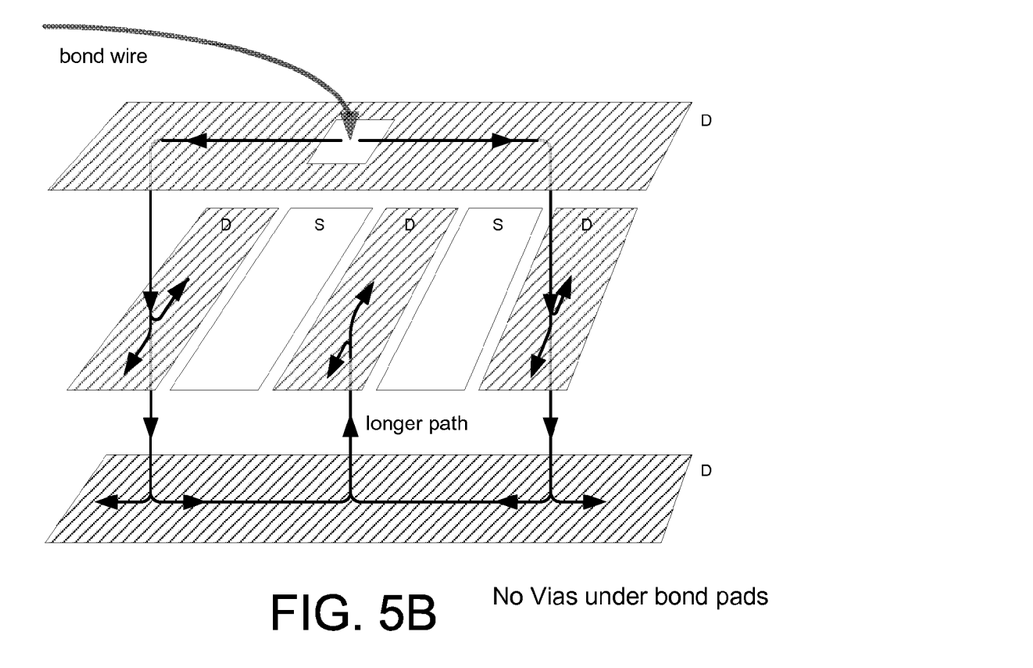

FIGS. 5A and 5B show different current paths, based on the location of vias between the metal layers.

In particular, FIG. 5A shows the flow of current between different metal layers, when three sets of vias are created between the metal layer. The placement of vias allows the current to flow vertically downwards in three different directions as shown 504, 506, and 508. To reach to the middle strip, for example, the current flows from the top metal layer via the paths 504, 506, and 508. FIG. 5B shows a second scenario where in the x-plane through the bond pad only two vias have been formed between the top metal layer and the middle metal layer (no via directly under the bond pad), while three vias have been formed between the middle metal layer and the bottom metal layer. In such implementations, the current first flows horizontally in the top layer from the bond pad to the vias connecting the top plate and the middle plate, and then vertically downwards along the two vias to the middle layer, and then horizontally in the bottom layer to the drain, and finally, after passing through the MOSFET (not shown) travels vertically upwards to reach the strip 502 of the upper metal layer. Thus, in this embodiment the current follows a longer path to reach the destination, in comparison to the path 506. Thus, the placement of via helps in reducing the current path. Herein, controlling the current path this way, is to obtain a desirable distribution of the current through the MOS devices. This technique helps make the current through the devices more uniform.

Figure 6:
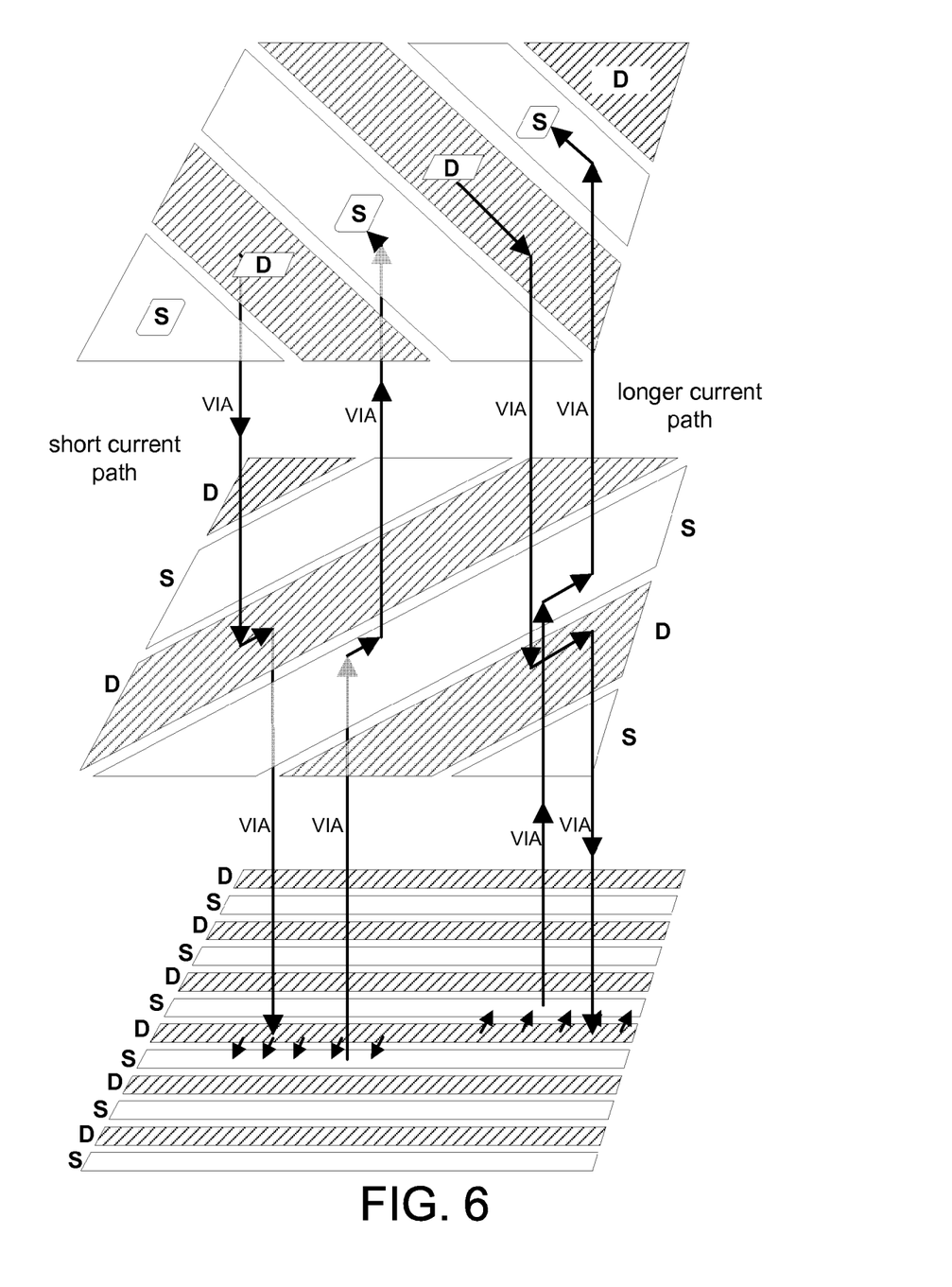
FIG. 6 depicts different current paths in the power transistor structure, based on via locations between metal layers.

FIG. 6 is another exemplary embodiment illustrating current flow in the metal layers.

In one embodiment, the vias are placed close to each other as shown. In such scenarios, the current path in the horizontal direction is minimized, i.e., the current first flows substantially vertically downward and then substantially vertically upwards to complete the loop. In other implementations, the vias are placed far from each other, requiring the current to follow a zigzag path to complete the loop. For instance, from the top metal layer current flows vertically downwards, then in a horizontal direction and then vertically upwards as shown to some extent in FIG. 5A and to a greater extent in FIG. 5B. Therefore, the vias are preferably placed close to each other for better current flow in the transistor. The resistance of the various vias placed in parallel is smaller than the sheet resistance of the metal layers, thereby leading to more current flow in vertical direction and lowering total resistance.

Exemplary Metal Layer

Figure 7:
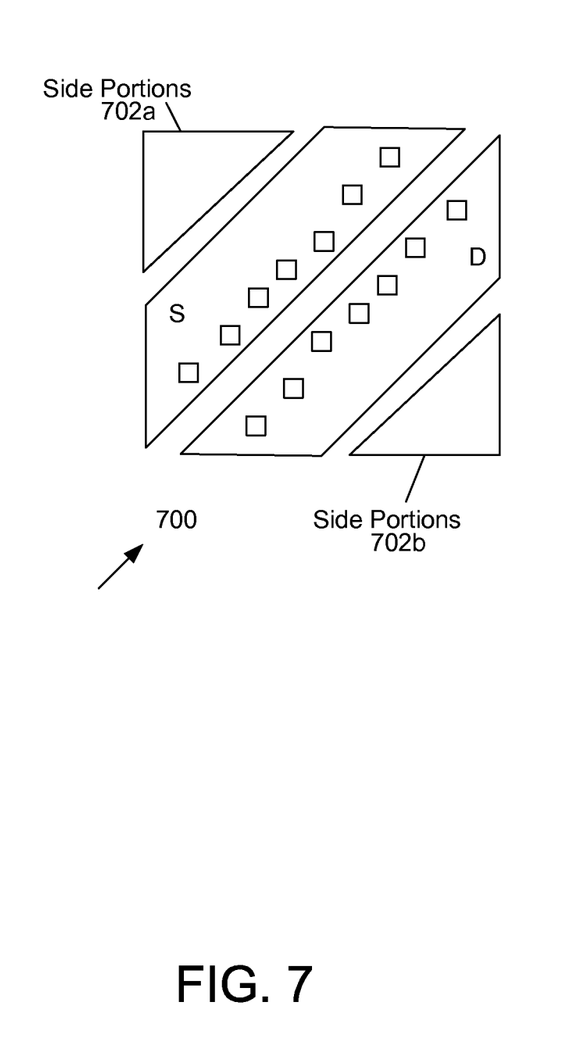
FIG. 7 shows an exemplary metal layer with side portions.

FIG. 7 shows the cross section 700 of the exemplary top metal layer 108 with alternating drain and source strips. As discussed above, the bond pads are placed in the middle of the top layer 108 so that the current flows equally throughout the device. In the current embodiment, the portions shown as 702a, 702b, for example, may be treated as different strips of the metal layer 108. Consequently, a bond pad can be placed on them. In particular, the main aim of the embodiment shown here is to maximize the number of strips of the metal layer 108 and to further maximize the number of bond wires.

Exemplary Applications

The transistor as described above can be used in any power device, for example, in USB ports, power switch, etc. Moreover, the transistor can be used in scenarios where very low impedance, of the order of 0.5 ohm, is required.

The transistor design as disclosed has many advantages. The transistor has one or more layers with source and drains terminals alternating with each other and arranged diagonally to strips in other layers. The diagonal configuration allows multiple current paths to be created between the metal layers to reduce resistance, and allow shorter bond wires to be used by appropriately placing the pads on the top metal layer, thus, further lowering the resistance. As a result, the resistance of the bond wires and metal interconnects is minimized. Moreover, the arrangement of the metal layers maximizes the number of parallel current paths to distribute the current equally in the device. The interdigitated source and drain connections create very short, mainly vertical paths to and from the transistors.

Those in the art will understand that the steps set out in the discussion above may be combined or altered in specific adaptations of the disclosure. The illustrated steps are set out to explain the particular embodiments shown, and it will be appreciated that ongoing technological developments may change the manner in which particular functions are performed. The particular embodiments are by way of example only and do not limit the scope of the present disclosure, which is defined solely by reference to the appended claims.

What is claimed is:

1. A power transistor array, the power transistor array comprising:
   a bottom metal layer including a plurality of strips, each corresponding to either drain or source strips, the drain and source strips being placed in parallel and alternating with each other;
   a top metal layer, above the bottom metal layer, including a plurality of strips, each strip corresponding to either drain or source strips, the drain and source strips being placed in parallel and alternating with each other, wherein the strips of the top metal layer are oriented at angle with respect to the strips of the bottom metal layer;
   a plurality of bond pads placed on the strips of the top metal layer, wherein each of the plurality of bond pads is arranged at a center of a respective strip such that a uniform current distribution through said metal layers is achieved; and
   a plurality of bond wires, each bond wire having one end attached to the corresponding bond pad.

2. The power transistor array of claim 1 further comprising one or more of the following metal layers, wherein each metal layer includes a plurality of strips, each corresponding to either drain or source strips, the drain and source strips being placed in parallel and alternating with each other:
   a first metal layer formed over the bottom metal layer, the strips of the first metal layer running in parallel to one another above the strips of the bottom metal layer;
   a second metal layer formed over the first metal layer, wherein the strips of the second metal layer are oriented perpendicular to the strips of the first metal layer below it;
   a third metal layer formed over the second metal layer, wherein the strips of the third metal layer are oriented diagonally with respect to the strips of the second metal layer below it;
   a fourth metal layer formed over the third metal layer and below the top metal layer, wherein the strips of the fourth metal layer are oriented perpendicular to the strips of the third metal layer below it; and
   the top metal layer formed over the fourth metal layer, wherein the strips of the top metal layer are oriented perpendicular to the strips of the fourth metal layer below it.

3. The power transistor array of claim 2, wherein the strips of the first metal layer are oriented perpendicular to the strips of the bottom metal layer.

4. The power transistor array of claim 2, wherein all metal layers below the top metal layer run in parallel to each other.

5. The power transistor array of claim 2, wherein the strips of the first metal layer are wider than the strips of the bottom metal layer.

6. The power transistor array of claim 1, wherein the strips of the top metal layer having a low resistance relative to the strips of the bottom metal layer.

7. The power transistor array of claim 1, wherein the metal layers are interconnected by means of vias, wherein a plurality of vias connect a strip of the bottom layer with a strip of the top layer.

8. The power transistor array of claim 7, wherein the number of vias and location of the vias is chosen to minimize the resistance path through the transistors of the array.

9. A power transistor array, comprising:
   a plurality of metal layers, each layer including a plurality of strips, each strip corresponding to either a drain strip or a source strip, wherein the metal layers include at least two of:
      a bottom metal layer, the strips of the bottom metal layer being arranged in parallel and alternating as drain strips and source strips, a first metal layer formed over the bottom metal layer, the strips of the first metal layer running in parallel to one another above the strips of the bottom metal layer;
      a second metal layer formed over the first metal layer, wherein the strips of the second metal layer are oriented perpendicular to the strips of the first metal layer;
      a third metal layer formed over the second metal layer, wherein the strips of the third metal layer are oriented diagonally with respect to the strips of the second metal layer;
      a fourth metal layer formed over the third metal layer, wherein the strips of the fourth metal layer are oriented perpendicular to the strips of the third metal layer; and
      a top metal layer formed over the fourth metal layer, the strips of the top metal layer being oriented perpendicular with respect to the strips of the fourth metal layer, and
   a plurality of drain and source bond pads each arranged near a center region of a respective strip, respectively such that a uniform current distribution through said metal layers is achieved, the bond pads connecting to the drain and source strips of the top metal layer, respectively.

10. The power transistor array of claim 9 further comprising at least one bond wire corresponding to each bond pad.

11. The power transistor array of claim 9, wherein each of the bond pads is formed in the middle of the strips of the top metal layer.

12. The power transistor array of claim 9 further comprising a plurality of vias formed between the strips of the metal layers.

13. A semiconductor integrated circuit comprising:
   a transistor array having a bottom metal layer and a top metal layer formed over the transistor, the bottom metal layer including a plurality of strips, each corresponding to either a drain or a source of a transistor of the transistor array, the drain and source strips being placed in parallel and alternating with each other, and
   the top metal layer being formed over the bottom metal layer, and including a plurality of strips, each strip corresponding to either a drain or a source of the transistor, the drain and source strips being placed in parallel and alternating with each other, wherein the strips of the top metal layer are oriented diagonally with respect to the strips of the bottom metal layer;

a plurality of bond pads, each being placed in a center of a respective strips of the top metal layer such that a uniform current distribution through said metal layers is achieved; and a plurality of bond wires, each bond wire having one end attached to the corresponding bond pad.

14. The power transistor array of claim 1, wherein the strips of the top metal layer are oriented diagonally with respect to the strips of the bottom metal layer.

* * * * *